(12) United States Patent
Cheng et al.

(10) Patent No.: US 10,170,370 B2
(45) Date of Patent: Jan. 1, 2019

(54) CONTACT RESISTANCE CONTROL IN EPITAXIAL STRUCTURES OF FINFET

(71) Applicant: Taiwan Semiconductor Manufacturing Co., Ltd., Hsinchu (TW)

(72) Inventors: Cheng-Wen Cheng, Hsinchu (TW); Chii-Horng Li, Zhubei (TW); Lilly Su, ChuBei (TW); Tuoh Bin Ng, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 15/960,072

(22) Filed: Apr. 23, 2018

(65) Prior Publication Data

US 2018/0315660 A1 Nov. 1, 2018

Related U.S. Application Data

(63) Continuation of application No. 15/493,915, filed on Apr. 21, 2017, now Pat. No. 9,953,875.
(Continued)

(51) Int. Cl.
*H01L 27/148* (2006.01)
*H01L 21/00* (2006.01)
(Continued)

(52) U.S. Cl.
CPC ........... *H01L 21/823431* (2013.01); *H01L 21/02576* (2013.01); *H01L 21/3065* (2013.01);
(Continued)

(58) Field of Classification Search
CPC ............ H01L 27/0886; H01L 27/0924; H01L 27/10841; H01L 29/785; H01L 29/78642; H01L 29/7926; H01L 29/66795; H01L 29/66545; H01L 21/823431; H01L 21/823487; H01L 21/823821; H01L 21/823885
(Continued)

(56) References Cited

U.S. PATENT DOCUMENTS

8,796,666 B1  8/2014 Huang et al.
8,815,712 B2  8/2014 Wan et al.
(Continued)

*Primary Examiner* — Hsien Ming Lee
(74) *Attorney, Agent, or Firm* — Sterne, Kessler, Goldstein & Fox, P.L.L.C.

(57) ABSTRACT

A method of forming a semiconductor device includes forming fin regions on a substrate, forming a patterned polysilicon structure over the fin regions, and etching back portions of the fin regions to form recessed fin regions. The method further includes forming a merged epitaxial region on the recessed fin regions and forming a capping layer on the merged epitaxial region using an etching gas and a deposition gas. The forming of the capping layer may include epitaxially growing a material of the capping layer faster along a first crystal direction of the capping layer than a second crystal direction of the capping layer by adjusting a ratio of a concentration of a first element in the etching gas to a concentration of a second element in the deposition gas, the first and second elements being different from each other, the first and second crystal directions being different from each other.

20 Claims, 7 Drawing Sheets

Related U.S. Application Data (60) Provisional application No. 62/428,222, filed on Nov. 30, 2016.

(51) Int. Cl.

| | | |
|---|---|---|
| H01L 21/8234 | (2006.01) |
| H01L 29/04 | (2006.01) |
| H01L 21/3065 | (2006.01) |
| H01L 27/088 | (2006.01) |
| H01L 29/78 | (2006.01) |
| H01L 29/06 | (2006.01) |
| H01L 29/08 | (2006.01) |
| H01L 29/66 | (2006.01) |
| H01L 21/02 | (2006.01) |

(52) U.S. Cl.
CPC ........ *H01L 21/823418* (2013.01); *H01L 21/823481* (2013.01); *H01L 27/0886* (2013.01); *H01L 29/045* (2013.01); *H01L 29/0653* (2013.01); *H01L 29/0847* (2013.01); *H01L 29/66545* (2013.01); *H01L 29/66636* (2013.01); *H01L 29/7851* (2013.01)

(58) Field of Classification Search
USPC ........ 257/220, 263, 328, 330, 331; 438/156, 438/173, 192, 212, 268
See application file for complete search history.

(56) References Cited

U.S. PATENT DOCUMENTS

| | | |
|---|---|---|
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,570,556 B1 | 2/2017 | Lee et al. |
| 9,576,814 B2 | 2/2017 | Wu et al. |
| 2017/0077228 A1 | 3/2017 | Lee et al. |
| 2017/0125410 A1* | 5/2017 | Li .................. H01L 21/823431 |

* cited by examiner

CONTACT RESISTANCE CONTROL IN EPITAXIAL STRUCTURES OF FINFET

CROSS-REFERENCE TO RELATED APPLICATIONS

The present application is a continuation of U.S. application Ser. No. 15/493,915, titled "Contact Resistance Control in Epitaxial Structures of FinFET" and filed on Apr. 21, 2017, now allowed, which is incorporated herein by reference in its entirety.

BACKGROUND

This disclosure generally relates to semiconductor devices and methods of fabricating the same.

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and finFETs.

Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The term "about" as used herein indicates the value of a given quantity varies by ±10% of the value, unless noted otherwise.

As used herein, the term "selectivity" refers to the ratio of the etch rates of two materials under the same etching conditions.

As used herein, the term "substrate" describes a material onto which subsequent material layers are added. The substrate itself may be patterned, and materials added on top of it may also be patterned, or may remain without patterning. Furthermore, "substrate" may be any of a wide array of semiconductor materials such as silicon, germanium, gallium arsenide, indium phosphide, etc. Alternatively, the substrate may be electrically non-conductive such as a glass or sapphire wafer.

As used herein, the term "high-k" refers to a high dielectric constant. In the field of semiconductor device structures and manufacturing processes, high-k refers to a dielectric constant that is greater than the dielectric constant of $SiO_2$ (i.e., greater than 3.9).

As used herein, the term "vertical" means nominally perpendicular to the surface of a substrate.

As used herein, the term "merged fin structure" refers to a fin structure having a merged epitaxial region grown epitaxially from two or more unmerged epitaxial regions of the fin structure.

As used herein, the term "substantially planar surface" refers to a surface having a height variation less than or equal to 5 nm between a highest point (also referred to herein as peak) and a lowest point (also referred to herein as valley) on the surface.

Overview

This disclosure provides exemplary methods for reducing contact resistance between epitaxial source/drain (S/D) regions in finFETs and other structures (e.g., S/D contact structures) of the finFET and/or other structures (e.g., interconnects, vias) of an integrated circuit including the finFET.

Exemplary finFETs

Figure 1:
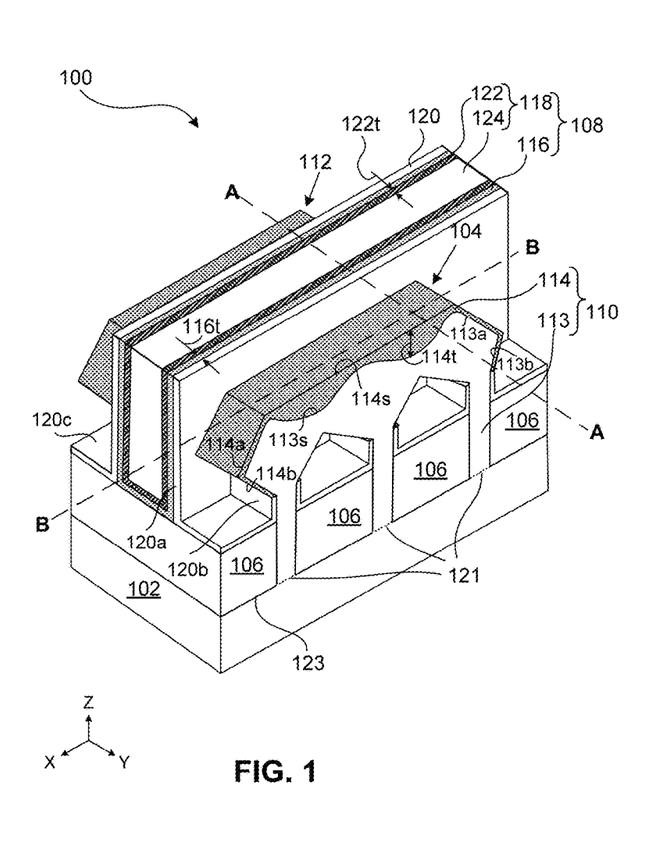
FIG. 1 is an isometric view of a finFET, in accordance with some embodiments.

FIG. 1 is an isometric view of a multi-fin finFET 100 in an integrated circuit taken after a gate replacement process, according to some embodiments. FIG. 1 is for illustrative purposes and is not drawn to scale.

According to some embodiments, finFET 100 is formed on a substrate 102, and includes a fin structure 104 having fin regions (not shown in FIG. 1; shown in FIGS. 6-7) and epitaxial regions 110 and 112, shallow trench isolation (STI) regions 106, a gate structure 108 disposed on fin regions of fin structure 104, and spacer 120. The isometric view of FIG. 1 is taken after formation of gate structure 108 in a gate replacement process. FIG. 1 shows one gate structure 108. However, there may be additional gate structure(s) (not shown) similar and parallel to gate structure 108. In addition, finFET 100 may be incorporated into the integrated circuit through the use of other structural components such as source/drain (S/D) contacts, gate contacts, vias, interconnect metal layers, dielectric layers, passivation layers, etc., that are omitted for the sake of clarity. The cross-sectional shape of fin structure 104 is illustrative and is not intended to be limiting.

Substrate 102 is a physical material on which finFET 100 is formed. According to some embodiments, substrate 102 includes a semiconductor material such as, but not limited to, silicon, germanium, a compound semiconductor including silicon carbide, gallium arsenide, gallium phosphide, indium phosphide, indium arsenide, indium antimonide, an alloy including silicon germanium carbide, silicon germanium, gallium arsenic phosphide, gallium indium phosphide, gallium indium arsenide, gallium indium arsenic phosphide, aluminum indium arsenide, aluminum gallium arsenide, or a combination thereof. In some embodiments, substrate 102 comprises a crystalline silicon substrate (e.g., a silicon wafer). In some embodiments, substrate 102 includes an epitaxial layer (epi-layer), and/or includes a silicon-on-insulator (SOI) structure. Further, substrate 102 may be doped with p-type dopants, such as boron, indium, aluminum, or gallium, or n-type dopants, such as phosphorus or arsenic. Doped substrate 102 may be configured for an n-type finFET, or alternatively configured for a p-type finFET.

STI regions 106 provide electrical isolation of finFET 100 from neighboring active and passive elements (not illustrated in FIG. 1) integrated with or deposited onto substrate 102. STI regions 106 are made of dielectric material. In some embodiments, STI regions 106 include silicon oxide, silicon nitride, silicon oxynitride, fluorine-doped silicate glass (FSG), a low-k dielectric material, and/or other suitable insulating material. In some embodiments, STI regions 106 include a multi-layer structure.

Gate structure 108 traverses fin regions of fin structure 104. The fin regions of fin structure 104 underlying gate structure 108 define the channel regions of finFET 100. Gate structure 108 includes a gate electrode 118 and a dielectric layer 116 adjacent to and in contact with gate electrode 118. In some embodiments, a thickness 116t of dielectric layer 116 is in the range of 1 nm to 5 nm. Gate structure 108 may further include capping layers, etch stop layers, and/or other suitable materials in various embodiments.

Dielectric layer 116 traverses fin regions of fin structure 104. In some embodiments, dielectric layer 116 includes one or more layers of silicon oxide, silicon nitride, silicon oxynitride, or high-k dielectric materials such as hafnium oxide ($HfO_2$), $TiO_2$, $HfZrO$, $Ta_2O_3$, $HfSiO_4$, $ZrO_2$, $ZrSiO_2$, or a combination thereof. Alternatively, high-k dielectric materials may comprise metal oxides. Examples of metal oxides used for high-k dielectrics include oxides of Li, Be, Mg, Ca, Sr, Sc, Y, Zr, Al, La, Ce, Pr, Nd, Sm, Eu, Gd, Tb, Dy, Ho, Er, Tm, Yb, Lu, and/or mixtures thereof. In some embodiments, dielectric layer 116 includes a single layer or a stack of insulating material layers. Dielectric layer 116 may be formed by chemical vapor deposition (CND), atomic layer deposition (ALD), physical vapor deposition (PVD), e-beam evaporation, or other suitable process. Spacer 120 includes insulating material such as silicon oxide, silicon nitride and protects the underlying regions during subsequent processing of finFET 100. Spacer 120 includes spacer portions 120a that form sidewalk of gate structure 108, spacer portions 120b that form sidewalls of fin structure 104, and spacer portions 120c that form protective layers on STI regions 106.

Gate electrode 118 may include a gate work function metal layer 122 and a gate metal fill layer 124. In some embodiments, gate work function metal layer 122 is disposed on dielectric layer 116. Gate work function metal layer 122 may include a single metal layer or a stack of metal layers. The stack of metal layers may include metals having work functions similar to or different from each other. In some embodiments, gate work function metal layer 122 includes any suitable material, such as aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. According to some embodiments, work function metal(s) that may be included in gate work function metal layer 122 in a p-type device include TiN, TaN, Ru, Mo, Al, WN, $ZrSi_2$, $MoSi_2$, $TaSi_2$, $NiSi_2$, WN, other suitable p-type work function metals, or combinations thereof. Exemplary work function metal(s) that may be included in work function metal layer 122 in an n-type device include Ti, Ag, TaAl, TaAlC, TiAlN, TaC, TaCN, TaSiN, Mn, Zr, other suitable n-type work function materials, or combinations thereof. Gate work function metal layer 122 may be formed using a suitably process such as ALD, CND, PVD, plating, or combinations thereof. In some embodiments, a thickness 122t of gate work function metal layer 122 is in the range of 2 nm to 15 nm.

Gate metal fill layer 124 may include a single metal layer or a stack of metal layers. The stack of metal layers may include metals different from each other. In some embodiments, gate metal till layer 124 includes any suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate metal fill layer 124 may be formed by ALD, PVD, CVD, or other suitable conductive material deposition process.

Fin structure 104 includes epitaxial regions 110 and 112 disposed on opposing sides of gate structure 108. Fin regions of fin structure 104 underlying gate structure 108 are regions formed from patterned portions of substrate 102 as described in detail below. Epitaxial regions 110 and 112 may form interfaces 121 with substrate 102 and interfaces (not shown in FIG. 1; shown as 221 in FIG. 2) with portions of fin structure 104 underlying gate structure 108. In some embodiments, interfaces 121 are coplanar with interfaces 123 formed between STI regions 106 and substrate 102. In some embodiments, interfaces 121 are either above or below the level of interfaces 123.

Epitaxial regions 110 and 112 are configured to function as S/D regions of finFET 100 and include epitaxially-grown semiconductor material. In some embodiments, the epitaxially grown semiconductor material is the same material as the material of substrate 102. In some embodiments, the epitaxially-grown semiconductor material includes a different material from the material of substrate 102 and imparts a strain on the channel regions underlying gate structure 108. Since the lattice constant of such epitaxially grown semiconductor material is different from the material of substrate 102, the channel regions are strained to advantageously increase carrier mobility in the channel regions of finFET 100. The epitaxially-grown semiconductor material may include semiconductor material such as germanium or silicon; or compound semiconductor materials, such as gallium arsenide, aluminum gallium arsenide; or semiconductor alloy, such as silicon germanium, or gallium arsenide phosphide.

In some embodiments, epitaxial regions 110 and 112 are grown by CVD, e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof. In some embodiments, epitaxial regions 110 and 112 are grown by an epitaxial deposition/partial etch process, which repeats the epitaxial deposition/partial etch process at least once. Such repeated deposition/partial etch process is also called a cyclic deposition-etch (CDE) process.

Epitaxial regions 110 and 112 may be in-situ doped during the epitaxial growth process. In various embodiments, epitaxial regions 110 and 112 may be doped with p-type dopants, such as boron, indium, or gallium; n-type dopants, such as phosphorus or arsenic; and/or combinations thereof; SiGe epitaxial regions 110 and 112 may be doped with p-type dopants, such as boron, gallium, or indium, n-type dopants, such as phosphorus or arsenic, and/or combinations thereof; Si epitaxial regions 110 and 112 may be doped with carbon and/or phosphorous. For p-type in-situ doping, p-type doping precursors, such as, but not limited to, diborane ($B_2H_6$), boron trifluoride ($BF_3$), and/or other p-type doping precursors can be used. For n-type in-situ doping, n-type doping precursors, such as, but not limited to, phosphine ($PH_3$), arsine ($AsH_3$), and/or other n-type doping precursor can be used. By using the in-situ doping process, the dopant concentration of the epitaxially-grown semiconductor material can be desirably controlled and achieved. In some embodiments, epitaxial regions 110 and 112 are not in-situ doped, and an ion implantation process is performed to dope epitaxial regions 110 and 112.

Each of epitaxial regions 110 and 112 may include merged region 113 disposed on substrate 102 and capping layer 114 disposed on merged region 113. Capping layer 114 wraps around portions of merged region 113 that are not covered by STI regions 106 or spacer portion 120b and planarizes the non-planar topography of top surface 113s of merged region 113 by providing a top surface 114s having a higher planarity (e.g., top surface 114s being substantially planar) than top surface 113s. Top surface 114s may act as a contact area for coupling other structures (e.g., S/D contact structures, interconnects, vias) of finFET 100 and/or the integrated circuit. Planarizing top surface 113s with capping layer 114 and/or reducing the non-planarity of merged region top surface 113s with the more planar capping layer 114 may help to reduce contact resistance between merged region 113 and the other structures coupled to it. Capping layer 114 may also act as an etch stop layer for merged region 113 during subsequent processing of finFET 100 and/or other devices in the integrated circuit.

Merged region 113 and capping layer 114 are epitaxially grown. In some embodiments, merged region 113 includes SiP with P concentration in a range from $1 \times 10^{20}$ to $4 \times 10^{21}$ atoms/$cm^3$ that is incorporated through in-situ growth. In some embodiments, merged region 113 may be epitaxially grown under a pressure ranging from about 10 Torr to about 300 Torr, at a temperature ranging from about 500° C. to about 800° C. (e.g., from about 600° C. to about 800° C., from about 600° C. to about 700° C., from about 500° C. to about 700° C., from about 700° C. to about 800° C.) using reaction gases such as, for example, an etching gas (e.g., HCl), a deposition gas having Si precursor (e.g., dichlorosilane (DCS) and/or $SiH_4$), a doping gas having P precursor (e.g., $PH_3$), $H_2$, and/or $N_2$. Based on the disclosure herein, a person of ordinary skill in the art will recognize that other ranges for temperature and pressure for growing merged region 113 are within the scope and spirit of this disclosure.

In some embodiments, capping layer 114 includes Si and does not include Ge. Capping layer 114 is epitaxially grown under process conditions different from the process conditions used for the growth of merged region 113. A selective epitaxial lateral overgrowth (ELO) process is used for the growth of capping layer 114. The process conditions (e.g., ratio of etching gas to deposition gas, ratio of etching gas element to deposition gas element, ratio of etching gas atom concentration to deposition gas atom concentration, temperature) for the growth of capping layer 114 are adjusted to achieve the higher planarity of capping layer surface 114s. For example, the process conditions may be adjusted to achieve a faster growth rate capping layer 114 along a [110] crystal direction (e.g., along Y-axis) of capping layer 114 compared to [001] (e.g., along Z-axis) and/or [111] crystal directions (e.g., direction perpendicular to surface 114a) of capping layer 114. Such controlled directional growth rate of capping layer 114 may achieve a planar capping layer top surface 114s and/or capping layer top surface 114s with the higher planarity than merged region top surface 113s. In some embodiments, such controlled directional growth rate of capping layer 114 may achieve top surface 114s that is not conformal to top surface 113s of merged region 113, and surfaces 114a and 113b of capping layer 114 that may be conformal to respective surfaces 113a and 113b of merged region 113. In some embodiments, capping layer surface 114s may be a {001} crystal plane of capping layer 114 and the [001] crystal direction may be perpendicular to capping layer surface 114s. In some embodiments, capping layer surface 114a and 114b may each be a {111} crystal plane of capping layer 114 and the crystal direction [111] may be perpendicular to capping layer surfaces 1114a and 114b.

In some embodiments, capping layer 114 may be grown at a temperature ranging from about 600° C. to about 800° C. (e.g., from about 600° C. to about 700° C. from about 700° C. to about 800° C., from about 650° C. to about 700° C.) using reaction gases such an etching gas (e.g., HCl), a deposition gas having Si precursor (e.g., dichlorosilane (DCS) and/or $SiH_4$), and a doping gas having P dopant precursor (e.g., $PH_3$). In some embodiments, an etching gas flow rate in the range from about 30 sccm to about 300 sccm (e.g., from about 30 sccm to about 50 sccm, from about 50 sccm to about 100 sccm, from about 100 sccm to about 200 sccm, from about 200 sccm to about 300 sccm), a deposition gas flow rate in the range from about 30 sccm to about 300 sccm (e.g., from about 30 sccm to about 50 sccm, from about 50 sccm to about 100 sccm, from about 100 sccm to about 200 sccm, from about 200 sccm to about 300 sccm), and a doping gas flow rate in the range from about 100 sccm to about 400 sccm (e.g., from about 100 sccm to about 150 sccm, from about 150 sccm to about 200 sccm, from about 250 sccm to about 300 sccm, from about 350 sccm to about 400 sccm) may be used during the growth of capping layer 114. In some embodiments, the planarity of capping layer top surface 114s may depend on the gas flow rates of the etching gas and the deposition gas having Si precursor used during the epitaxial growth of capping layer 114. Based on the disclosure herein, a person of ordinary skill in the art will recognize that other ranges for gas flow rate and temperature for growing merged region 114 are within the scope and spirit of this disclosure.

In some embodiments, capping layer 114 may be grown in a gas mixture having a ratio of an etching gas element concentration (EGEC) (e.g., Cl atom concentration) to a deposition gas element concentration (DGEC) (e.g., Si atom concentration) in a range from about 3 to about 10 (e.g., from about 3 to about 5, from about 4 to about 6, from about 5 to about 7, from about 6 to about 8, from about 8 to about 10). The planarity of capping layer top surface 114s may depend on this EGEC/DGEC ratio and a certain EGEC/DGEC ratio may be selected to achieve a desired planarity. In some embodiments, capping layer 114, grown in a gas mixture having the EGEC/DGEC ratio in a range from about 6 to about 8, may have a more planar top surface 114s than capping layer 114 grown in a gas mixture having the EGEC/DGEC ratio in a range from about 3 to about 5. In some embodiments, capping layer 114, grown in a gas mixture having the EGEC/DGEC ratio in a range from about 6 to about 8, may have a vertical distance between a highest point (also referred to herein as peak) and a lowest point (also referred to herein as valley) on top surface 114s less than about 3 nm. In some embodiments, capping layer 114, grown in a gas mixture having the EGEC/DGEC ratio in a range from about 3 to about 5, may have a vertical distance between a peak and a valley on top surface 114s ranging from about 3 nm to about 5 nm. Based on the disclosure herein, a person of ordinary skill in the art will recognize that other ranges for the EGEC/DGEC ratio are within the scope and spirit of this disclosure.

Furthermore, in some embodiments capping layer 114 may have a dopant concentration ranging from about $1 \times 10^{19}$ atoms/$cm^3$ to about $1 \times 10^{21}$ atoms/$cm^3$ (e.g., about $1 \times 10^{20}$ atoms/$cm^3$, about $0.5 \times 10^{20}$ atoms/$cm^3$) that is achieved through in-situ doping. Capping layer may have a thickness 114t on top surface 113s in the range from about 2 nm to about 7 nm. Based on the disclosure herein, a person of ordinary skill in the art will recognize that other ranges of doping concentrations and thicknesses for capping layer 114 are within the scope and spirit of this disclosure.

Figure 2:
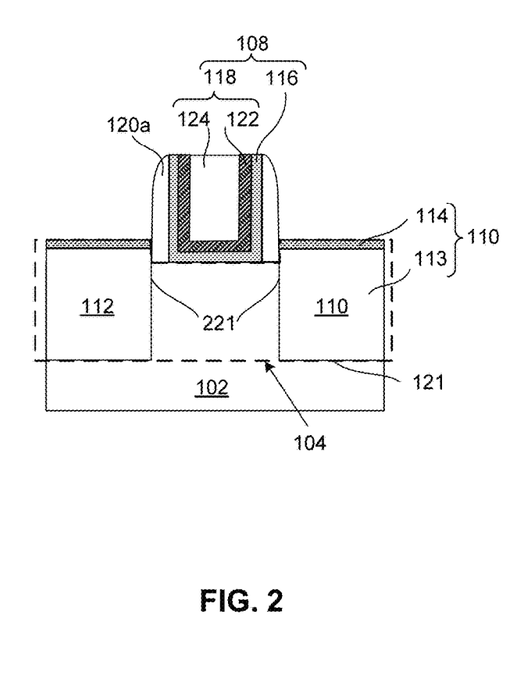
FIG. 2 is a cross-sectional view of the finFET of FIG. 1 along line A-A, in accordance with some embodiments.

FIG. 2 is a cross-sectional view of finFET 100 along line A-A of FIG. 1, according to some embodiments. 1. It is noted that the illustrations of exemplary finFET 100 in FIGS. 1-2 may not be to scale. The cross-sectional view shows an exemplary profile of gate structure 108, spacer portions 120a, fin structure 104 including merged region 113 and capping layer 114 of S/D regions 110 and 112 on substrate 102. FinFET 100 includes interface 121 with substrate 102 and interfaces 221 with regions of fin structure 104 underlying gate structure 108.

Figure 3:
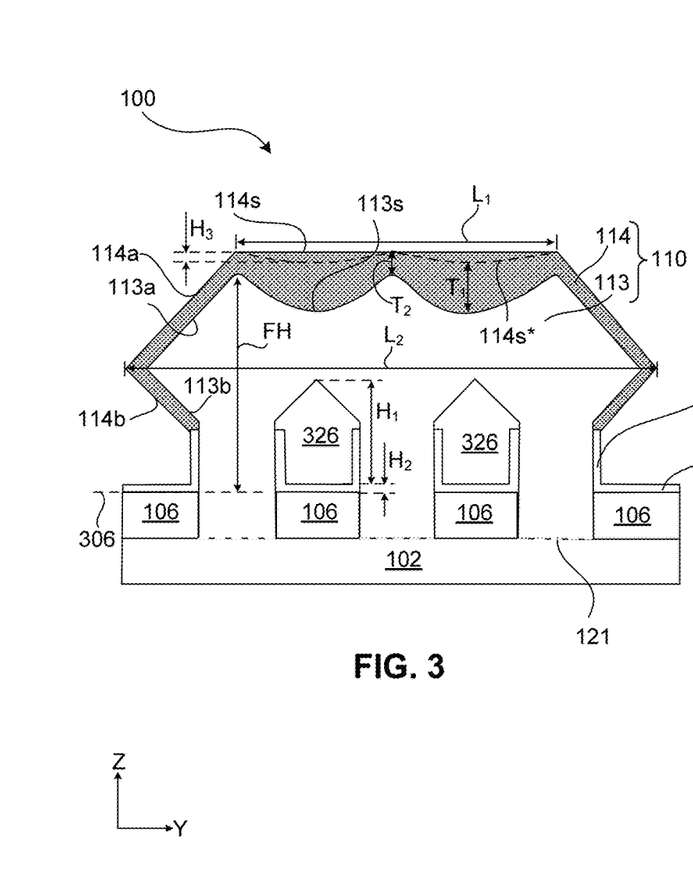
FIG. 3 is a cross-sectional view of the finFET of FIG. 1 along line B-B, in accordance with some embodiments.

FIG. 3 is a cross-sectional view of finFET 100 along line B-B of FIG. 1, according to some embodiments. It is noted that the illustrations of exemplary finFET 100 in FIGS. 1-3 may not be to scale. FIG. 3 shows an exemplary profile of fin structure 104 including merged region 113 and capping layer 114 of S/D region 110, spacer portions 120b and 120c, and STI regions 106 on substrate 102. Interface 121 between merged region 113 and substrate 102. In some embodiments, the profile of epitaxial region 110 includes a fin height FH in the range from about 33 nm to about 60 nm. The fin height FH may be defined as a vertical dimension of the portion of merged regions 113 on substrate 102 that extends above a plane 306 along Y-axis. In some embodiments, the profile of epitaxial region 110 includes an $L_1/L_2$ ratio in the range from about 0.4 to about 0.7, where $L_1$ is defined as a lateral dimension of top surface 114s along Y-axis and $L_2$ is defined as a lateral dimension across the widest portion of epitaxial region 110 along Y-axis. As shown in FIG. 3, an insulating material (e.g., air) comprising voids 326 is included within finFET 100. Voids 326 are located between unmerged portions of epitaxial region 110, where a ratio of maximum height $H_1$ of air gaps or voids 326 to thickness of spacer portions 120e is in a range from about 0.2 to about 3, according to some embodiments. The cross-sectional profile of voids 326 are not limited to the pentagon shape shown in FIG. 3, but may have other geometric shape (e.g., circular, triangular, rectangular).

In some embodiments, capping layer 114 surface topography may vary between top surface 114s and top surface 114s* depending on the EGEC/DGEC ratio as discussed above. In some embodiments, capping layer 114 may have a top surface 114s* that has a vertical dimension $H_3$ greater than 0 nm and less than about 5 nm (e.g., in a range from about 1 nm to about 4 nm) between the highest and lowest points on top surface 114s*. In some embodiments, capping layer 114 may have a top surface 114s when the vertical dimension $H_3$ is less than 1 nm (e.g., equal to about 0 nm). The vertical dimension $H_3$ may be varied, and as a result the planarity of capping layer 114's top surface may be varied by adjusting the EGEC/DGEC ratio in a range from about 3 to about 10 (e.g., from about 3 to about 5, from about 4 to about 6, from about 5 to about 7, from about 6 to about 8, from about 8 to about 10). In some embodiments, top surface 114s may be obtained at a higher EGEC/DGEC ratio than top surface 114s*.

In some embodiments, top surface 114s of capping layer 114 is not conformal to top surface 113s of merged region 113, but surfaces 114a and 113b of capping layer 114 may be conformal to respective surfaces 113a and 113b of merged region 113. In some embodiments, finFET 100 may have a $T_1/T_2$ ratio greater than 1 (e.g., greater than about 1.1, 1.5, 2, or 5; in a range from about 1.1 to about 5), where $T_1$ may be a vertical dimension between valleys (lowest points) on capping layer top surface 114s* and merged region top surface 113s and $T_2$ may be a vertical dimension between peaks (highest points) on capping layer top surface 114s* and merged region top surface 113s. The variations in $T_1/T_2$ ratio may be obtained as required per device design by adjusting, for example, the EGEC/DGEC ratio as discussed above.

Figure 4:
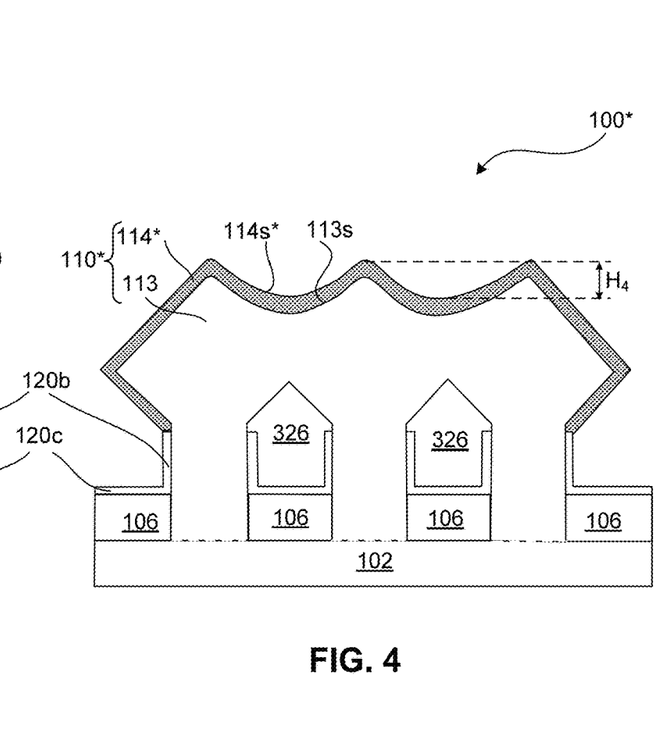
FIG. 4 is a cross-sectional view of a finFET.

FIG. 4 illustrates one of the benefits of using the ELO process to achieve capping layer 114. FIG. 4 is a cross-sectional view of a finFET 100*, which may be similar to finFET 100 except for capping layer 114* that is grown epitaxially on merged region 113 using a non-ELO process. In the non-ELO process, capping layer 114* is grown in a gas mixture having an etching gas element concentration (EGEC) (e.g., Cl atom concentration) to a deposition gas element concentration (DGEC) (e.g., Si atom concentration) ratio that is equal to or less than about 1. The non-ELO process grows capping layer 114* to be conformal to the underlying topography of merged region 113. This conformal growth of capping layer 114* leads to a non-planar topography of top surface 114s* of capping layer 114*, which in turn leads to high contact resistance between merged region 113 of finFET 100* and any other structure coupled to it. Comparison of profiles of finFETs 100 and 100* shows several improvements in epitaxial region 110 compared to epitaxial region 110*. For example, there is an increase in overall merged area of epitaxial region 110 compared to epitaxial region 110*, where the increase is in a range from 60% to 80%. The vertical dimension $H_3$ (FIG. 3) is equal to or less than 5 nm, whereas the vertical dimension $H_4$ (FIG. 4) between highest and lowest points on non-planar top surface 114s* of epitaxial region 110* is greater than 15 nm (e.g., greater than 20 nm, 25 nm).

An Example Method for Fabricating a FinFET

Figure 10:
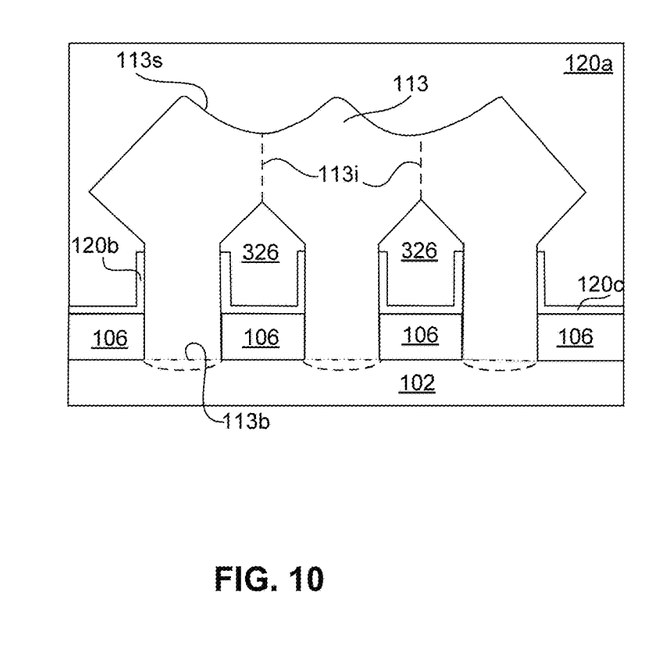
FIGS. 10-11 are cross-sectional views of a finFET at various stages of its fabrication process, in accordance with some embodiments.
Figure 11:
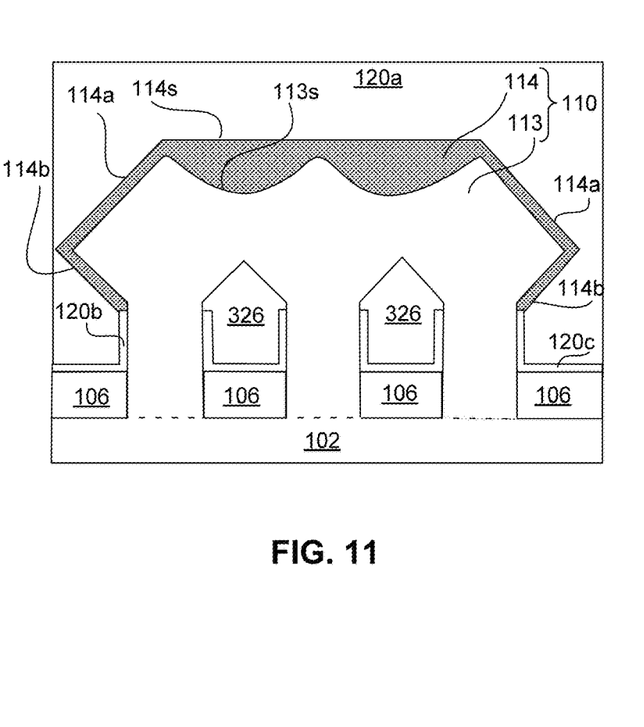

FIGS. 5-9 are isometric views of finFET 100 (as illustrated in FIGS. 1-3) at various stages of its fabrication, according to some embodiments. FIGS. 10-11 are cross-sectional views along lines C-C of finFET 100 at various stages of its fabrication, according to some embodiments.

Figure 5:
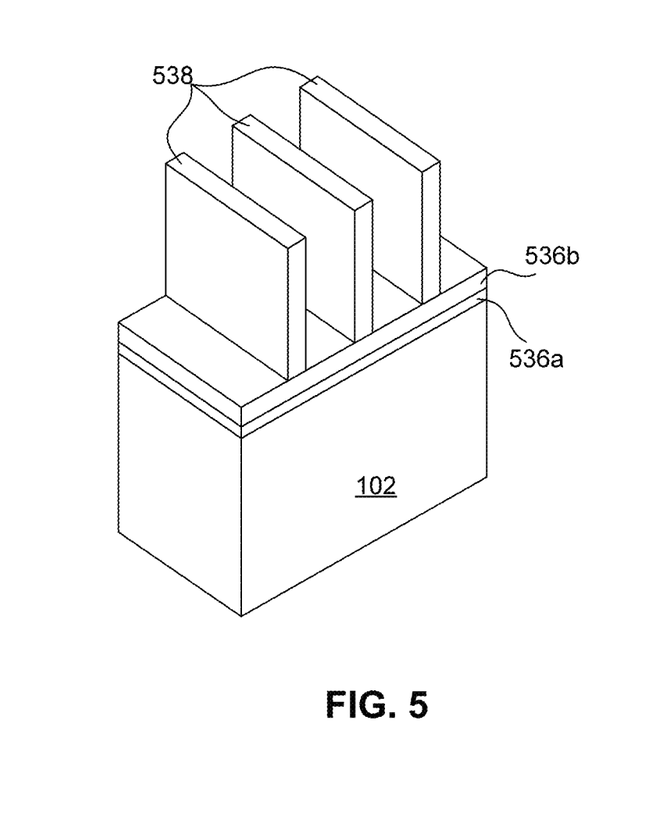
FIGS. 5-9 are isometric views of a finFET at various stages of its fabrication process, in accordance with some embodiments.

FIG. 5 is an isometric view of partially fabricated finFET 100 after patterning of photoresist on substrate 102 for formation of fin structures 104. Fin structure 104 is formed by etching into substrate 102. A pad layer 536a and a hardmask layer 536b are formed on substrate 102. Pad layer 536a may be a thin film comprising silicon oxide formed, for example, using a thermal oxidation process. Pad layer 536a may also act as an etch stop layer for etching hardmask layer 536b. In an embodiment, mask layer 536b is formed of silicon nitride, for example, using LPCVD or PECVD. Hardmask layer 536b is used as a hard mask during subsequent photolithography processes. A patterned photoresist layer 538 is formed on hardmask layer 436b.

Figure 6:
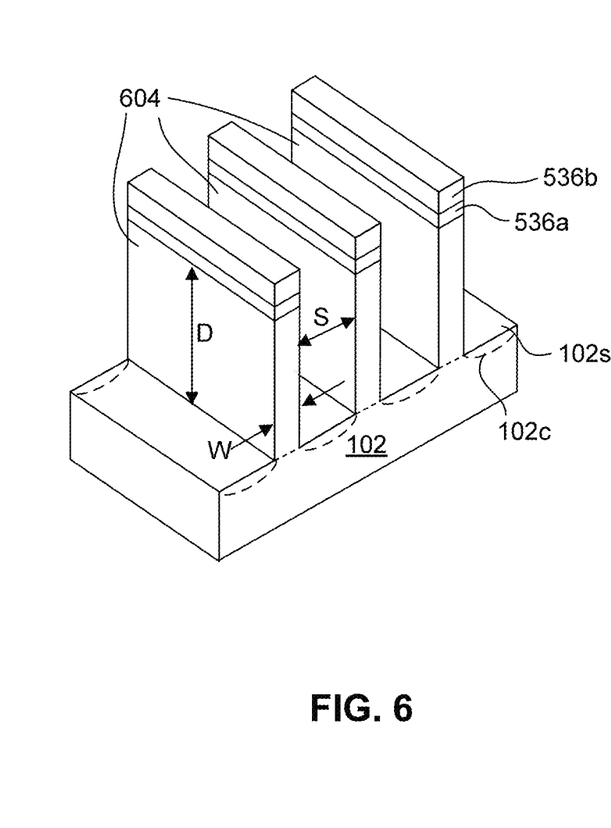

FIG. 6 is an isometric view of partially fabricated finFET 100 after the exemplary formation of fin regions 604. Portions of hardmask layer 536b and pad layer 536a that are not covered by patterned photoresist layer 538 are etched to expose underlying substrate 102. The exposed substrate 102 is then etched to form fin regions 604. Patterned photoresist 538 is then removed. In some embodiments, fin regions 604 each have fin widths W smaller than about 30 nm and depth D in a range from 210 nm to 250 nm, while spacing S between fin regions 604 is less than about 50 nm. In some embodiments, top surface of substrate 102 may be planar as surface 102s or curved as surface 102c depending on the etching process used to form fin regions 604.

Figure 7:
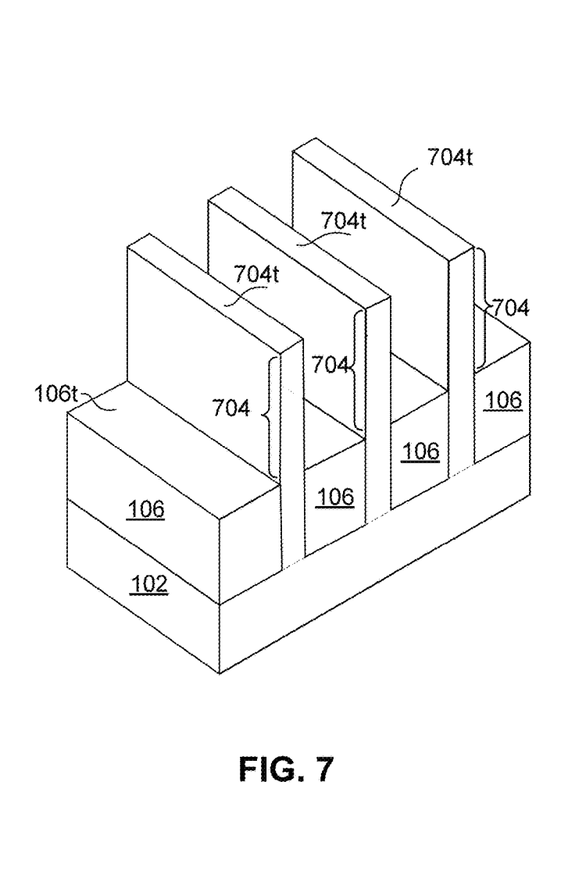

FIG. 7 is an isometric view of partially fabricated finFET 100 after the exemplary formation of STI regions 106. The formation of STI regions 106 involves deposition and etching of a dielectric material. The dielectric material may include silicon oxide. In some embodiments, other dielectric materials, such as silicon nitride, silicon oxynitride, fluoride-doped silicate glass (FSG), or a low-k dielectric material, may also be used. In some embodiments, the dielectric material may be formed using a flowable CVD (FCVD) process, a high-density-plasma (HDP) CVD process, using silane ($SiH_4$) and oxygen ($O_2$) as reacting precursors. In other embodiments, the dielectric material may be formed using a sub-atmospheric CVD (SACVD) process or high aspect-ratio process (HARP), wherein process gases may comprise tetraethoxysilane (TEOS) and/or ozone ($O_3$). In yet other embodiments, the dielectric material may be formed using a spin-on-dielectric (SOD) such as hydrogen silsesquioxane (HSQ) or methyl silsesquioxane (MSQ).

A chemical mechanical polishing or a wet etching is then performed to remove hardmask layer 536b and pad layer 536a. This removal is followed by an etching of the dielectric material deposited on substrate 102 to form STI regions 106 as shown in FIG. 7. Etching the dielectric material may be performed using a wet etching process, for example, by dipping substrate 102 in hydrofluoric acid (HF). Alternatively, the etching operation may be performed using a dry etching process, for example, using $CHF_3$ or $BF_3$ as etching gases. Upper fin portions 704 of fin regions 604, protruding over flat top surfaces 106t of STI regions 106 are used to form channel regions of finFET 100. Upper fin portions 704 may comprise top surfaces 704t. In some embodiments, flat top surfaces 106t of STI regions 106 are lower than top surfaces 704t. In some embodiments, a vertical dimension of each of the upper fin portions 704 ranges from 15 nm to 50 nm. In another embodiment, a vertical dimension of each of the upper fin portions 704 ranges from 20 nm to 40 nm. In another embodiment, a vertical dimension of each of the upper fin portions 704 ranges from 25 nm to 35 nm.

Figure 8:
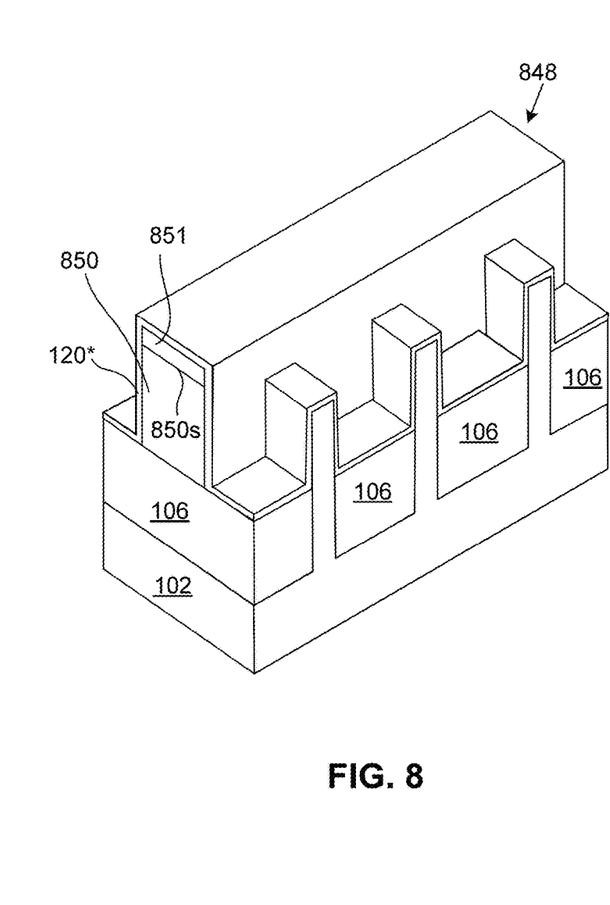

FIG. 8 is an isometric view of a partially fabricated finFET 100 after the exemplary formation of a structure 848 on fin regions 704 and STI regions 106. Structure 848 includes a patterned polysilicon structure 850, a hard mask 851, and an unpatterned spacer 120*. Patterned polysilicon structure 850 is formed over top surfaces 106t of STI regions 106 and wrapped around surfaces of fin regions 704 protruding over STI regions 106. Hard mask 851 comprising insulating material such as silicon nitride is disposed over top surface 850s of patterned polysilicon structure 850. Unpatterned spacer 120* is disposed to blanket exposed surfaces of patterned polysilicon 850 and hard mask 851. Unpatterned spacer 120* also blankets top surfaces 106t of STI regions 106 and surfaces of fin regions 704 protruding over STI regions 106 that are not covered by patterned polysilicon structure 850.

Patterned polysilicon structure 850 is formed by any suitable process. For example, patterned poly silicon structure 850 can be formed by a process including deposition, photolithography, and etching. Deposition processes include CVD, PVD, ALD, other suitable methods, and/or combinations thereof. Photolithography includes photoresist coating (e.g., spin-on coating), soft baking, mask aligning, exposure, post-exposure baking, developing the photoresist, rinsing, drying (e.g., hard baking), other suitable processes, and/or combinations thereof. Etching processes include dry etching, wet etching, and/or other etching methods (e.g., reactive ion etching). Unpatterned spacer 120* may include dielectric material such as silicon oxide, silicon carbide, silicon nitride, silicon oxynitride, or other suitable material. A blanket layer of a dielectric material may be formed by CVD, PVD, ALD, or other suitable technique.

Figure 9:
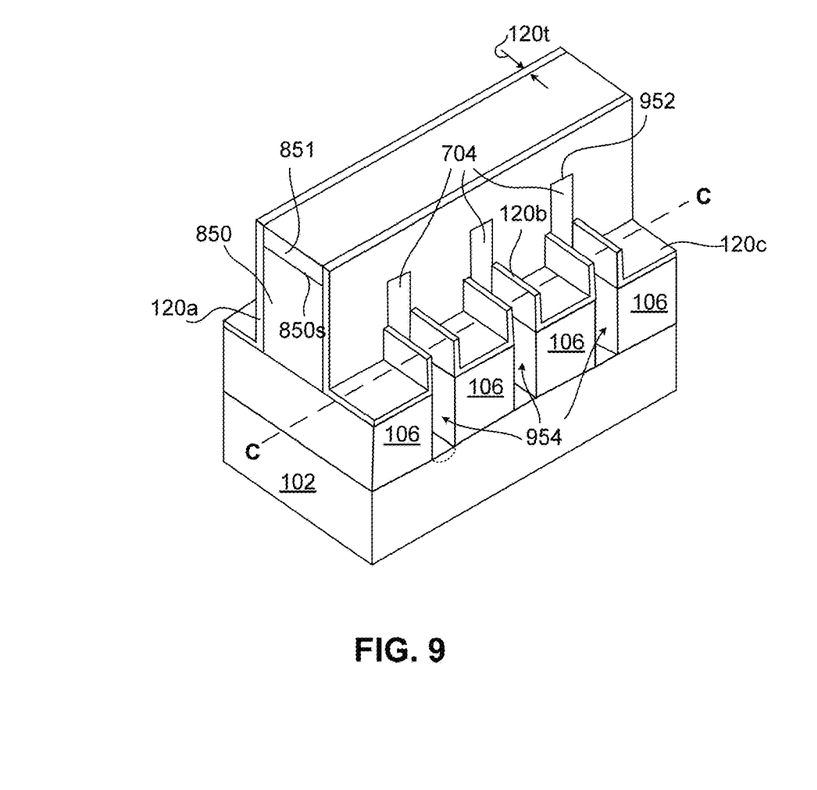

FIG. 9 is an isometric view of partially fabricated finFET 100 after the exemplary formation of spacer 120 and recessed fin regions 954. Unpatterned spacer 120* is dry etched using, for example, reactive ion etching (RIE) to form spacer 120 having spacer portions 120a, 120b, and 120c as shown in FIG. 8. Spacer 120 may have a thickness 120t in a range from 5 nm to 15 nm. The portions of fin regions 704 that are not covered by patterned polysilicon structure 850 and spacer 120a are recessed to form recessed fin regions 954. The unrecessed portions of fin regions 704 underlies spacer portions 120a and patterned polysilicon structure 850 and form interfaces 952 with spacer portions 120a and patterned polysilicon structure 850. In one embodiment, a biased etching process is performed to form recessed fin regions 954. The etching process may be performed under a pressure of 1 mTorr to 1000 mTorr, a power of 50 W to 1000 W, a bias voltage of 20 V to 500 V, at a temperature of 40° C. to 60° C., and using a HBr and/or $Cl_2$ as etch gases. During the etching process, top surface 850s of patterned polysilicon structure 850 is protected from being etched by hard mask 851.

FIG. 10 is a cross-sectional view of the structure of FIG. 9 along line C-C after the exemplary formation of merged region 113 of epitaxial region 110. It is noted that the cross-sectional profile of in FIG. 10 may not be to the same scale as FIG. 9.

Merged region 113 is epitaxially grown from recessed fin regions 954 and unrecessed portions of fin regions 704. Merging of region 113 at interfaces 113i occurs after portions of merged region 113 grow to a height above spacer portions 120b, which enables them to grow vertically and laterally. STI regions 106 and spacer portions 120b constrain the lateral growth of the portions enclosed by STI regions 106 and spacer portions 120b. Merged region 113 includes epitaxially-grown semiconductor material such as, but not limited to SiGe.

In some embodiments, merged region 113 includes SiP with P concentration in a range from $1\times10^{20}$ to $4\times10^{21}$ atoms/$cm^3$ that is incorporated through in-situ growth. Merged region 113 may be epitaxially grown under a pressure of 10 Torr to 300 Torr, at a temperature of 500° C. to 800° C. (e.g., from about 600° C. to about 800° C., from about 600° C. to about 700° C., from about 500° C. to about 700° C., from about 700° C. to about 800° C.) using reaction gases such as HCl as an etching agent, $GeH_4$ as Ge precursor, dichlorosilane (DCS) and/or $SiH_4$ as Si precursor, $PH_3$ as P precursor, $H_2$, and/or $N_2$.

FIG. 11 is a cross-sectional view of the structure of FIG. 10 after the exemplary formation of capping layer 114 of epitaxial region 110. It is noted that the cross-sectional profile of in FIG. 11 may not be to the same scale as FIGS. 9-10.

Capping layer 114 is disposed on merged region 113 to wrap around portions of merged region 113 that are not covered by STI regions 106 or spacer portion 120b. In some embodiments, capping layer 114 includes Si and does not include Ge. Capping layer 114 may be epitaxially grown under process conditions different from the process conditions used for the growth of merged region 113. An ELO process is used for the growth of capping layer 114. The process conditions (e.g., ratio of etching gas to deposition gas, ratio of etching gas element to deposition gas element, ratio of etching gas atom concentration to deposition gas atom concentration, temperature) for the growth of capping layer 114 are adjusted to achieve the higher planarity of capping layer surface 114s. For example, the process conditions may be adjusted to achieve a faster growth rate capping layer 114 along a [110] crystal direction (e.g., along Y-axis) of capping layer 114 compared to [001] (e.g., along Z-axis) and/or [111] crystal directions (e.g., direction perpendicular to surface 114a) of capping layer 114. Such controlled directional growth rate of capping layer 114 may achieve a planar capping layer top surface 114s and/or capping layer top surface 114s with the higher planarity than merged region top surface 113s.

In some embodiments, capping layer 114 may be grown at a temperature of 600° C. to 800° C. (e.g., from about 600° C. to about 700° C., from about 700° C. to about 800° C., from about 650° C. to about 700° C.) using reaction gases such as HCl as an etching gas, dichlorosilane (DCS) and/or Sift as Si precursor deposition gas, and $PH_3$ as P dopant precursor doping gas. An HCl gas flow rate in the range from 30 sccm to 300 sccm (e.g., from about 30 sccm to about 50 sccm, from about 50 sccm to about 100 sccm, from about 100 sccm to about 200 sccm, from about 200 sccm to about 300 sccm), a DCS gas flow rate in the range from 30 sccm to 300 sccm (e.g., from about 30 sccm to about 50 sccm, from about 50 sccm to about 100 sccm, from about 100 sccm to about 200 sccm, from about 200 sccm to about 300 sccm), and a $PH_3$ gas flow rate in the range from 100 sccm to 400 sccm (e.g., from about 100 sccm to about 150 sccm, from about 150 sccm to about 200 sccm, from about 250 sccm to about 300 sccm, from about 350 sccm to about 400 sccm) may be used during the growth of capping layer 114, according to some embodiments.

In some embodiments, the etching gas and Si precursor deposition gas flow is adjusted during the epitaxial growth of capping layer 114 such that the process gas mixture has a ratio of etching gas element (e.g., Cl atom) to deposition gas element (e.g., Si atom) concentration in a range from about 3 to about 10. Furthermore, in some embodiments, capping layer 114 may have a dopant concentration of about $1\times10^{20}$ atoms/$cm^3$ that is achieved through in-situ doping. Capping layer may have a thickness 114t on top surface 113s in the range from about 2 nm to about 7 nm, according to some embodiments.

Formation of the structures of FIG. 11 may be followed by formation of other elements of finFET 100 such as gate structure 108 using a replacement metal gate process, interlayer dielectric layer, S/D contacts, gate contacts, metal gate structure, vias, interconnect metal layers, dielectric layers, passivation layers, etc., that are not shown for the sake of simplicity.

Figure 12:
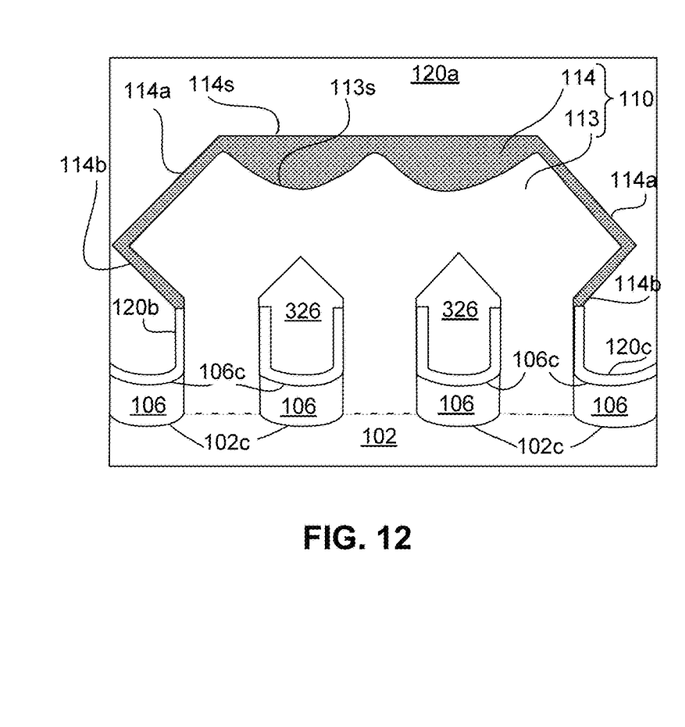
FIG. 12 is a cross-sectional view of a finFET, in accordance with some embodiments

FIG. 12 is another cross-sectional view along line A-A of finFET 100 of FIG. 1, according to some embodiments. Elements in FIG. 12 with the same annotations as elements in FIGS. 1-3 and 11 are described above. A person of ordinary skill in the art will recognize that the view of finFET 100 in FIG. 12 is shown for illustration purposes and may not be drawn to scale.

FIG. 12 illustrates curved top surfaces 106c of STI regions 106 and curved top surfaces of spacer portions 120c as a result of the underlying curved surface 102c of substrate 102. As discussed above with reference to FIG. 6, the curved surface 102c may be due to the etching process used to form fin regions 604.

Example Operations for Fabricating a FinFET

Figure 13:
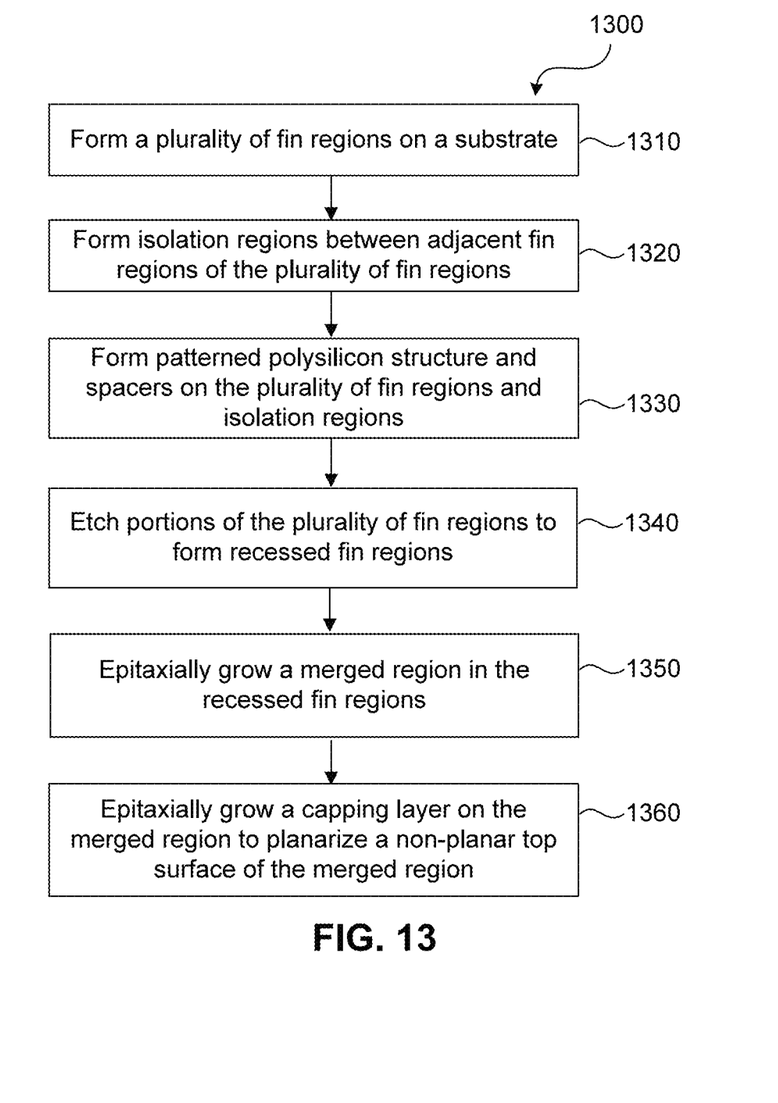
FIG. 13 is a flow diagram of a method for fabricating a finFET, in accordance with some embodiments.

FIG. 13 is a flow diagram of an exemplary method 1300 for fabricating finFET 100. Solely for illustrative purposes, the operations illustrated in FIG. 13 will be described with reference to the example fabrication process illustrated in FIGS. 5-11. Operations can be performed in a different order or not performed depending on specific applications. It should be noted that method 1300 does not produce completed finFETs 100 and 300. Accordingly, it is understood that additional processes may be provided before, during, and after method 1300, and that some other processes may only be briefly described herein.

In operation 1310, a plurality of fin regions are formed on a substrate. For example, a plurality of fin regions similar to fin region 704 are formed on substrate 102. Formation of fin region 704 may include patterning and etching of substrate 102. The patterning may be performed by photolithographic processes and the etching may be performed by dry etching (e.g., RIE).

In operation 1320, isolation regions are formed on the substrate between adjacent fin regions of the plurality of fin regions. For example, STI regions 106 are formed on substrate 102. The formation of STI regions 106 may involve deposition and etching of a dielectric material. The dielectric material may include silicon oxide, silicon nitride, silicon oxynitride, fluoride-doped silicate glass (FSG), or a low-k dielectric material. In some embodiments, the dielectric material may be formed using a FCVD process, a HDPCVD process, using $SiH_4$ and $O_2$ as reacting precursors. In other embodiments, the dielectric material may be formed using a SACVD process or HARP, wherein process gases may comprise TEOS and/or $O_3$. Etching the dielectric material may be performed using a wet etching process, for example, by dipping substrate 102 in hydrofluoric acid (HF). Alternatively, the etching operation may be performed using a dry etching process, for example, using $CHF_3$ or $BF_3$ as etching gases.

In operation 1330, a patterned polysilicon structure, a hard mask, and spacer are formed on the fin regions and isolation regions. For example, patterned polysilicon structure 850, hard mask 851, and spacer 120 are formed. Patterned polysilicon structure 850 is formed by a process including deposition, photolithography, and etching. Deposition processes may include CVD, PVD, ALD, other suitable methods, and/or combinations thereof. Etching processes may include dry etching, wet etching, and/or other etching methods (e.g., reactive ion etching). Formation of spacers 120 deposition of a blanket layer of a dielectric material (e.g., silicon oxide, silicon carbide, silicon nitride, silicon oxynitride) over patterned polysilicon structure 850 by CVD, PVD, ALD, or other suitable technique followed by an anisotropic etching of the dielectric material to form spacers 120.

In operation 1340, portions of the plurality of fin regions are etched to form recessed fin regions. For example, recessed fin regions similar to recessed fin region 954 are formed. Formation of recessed fin region 954 includes etching a portion of fin region 704 that is not covered by patterned polysilicon structure 850 and spacer portion 120a. The etching process may be performed under a pressure of 1 mTorr to 1000 mTorr, a power of 50 W to 1000 W, a bias voltage of 20 V to 500 V, at a temperature of 40° C. to 60° C., and using a HBr and/or $Cl_2$ as etch gases.

In operation 1350, a merged region is epitaxially grown. For example, merged region 113 is formed. Merged region 113 may include SiP and may be epitaxially grown under a pressure of 10 Torr to 300 Torr, at a temperature of 500° C. to 800° C. using reaction gases such as HCl as an etching agent, $GeH_4$ as Ge precursor, DCS and/or $SiH_4$ as Si precursor, $PH_3$ as P precursor, $H_2$, and/or $N_2$. Merged region 113 may be in-situ doped with n-type dopant (e.g., phosphorus) to have a dopant concentration in a range from $1\times10^{20}$ to $4\times10^{21}$ atoms/$cm^3$.

In operation 1360, a capping layer is epitaxially grown on the merged region. For example, capping layer 114 is grown on merged region 113. Capping layer 114 may include Si and does not include Ge. Capping layer 114 is epitaxially grown using a selective ELO. The process conditions for the growth of capping layer 114 are adjusted to achieve a faster growth rate for capping layer 114 along a [110] crystal direction (e.g., along Y-axis) of capping layer 114 compared to [001] (e.g., along Z-axis) and/or [111] crystal directions (e.g., direction perpendicular to surface 114a) of capping layer 114. Capping layer 114 may be grown at a temperature of 600° C. to 800° C. using reaction gases such as HCl as an etching agent, dichlorosilane (DCS) and/or $SiH_4$ as Si precursor, and $PH_3$ as P dopant precursor. An HCl gas flow rate in the range from 30 sccm to 300 sccm, a DCS gas flow rate in the range from 30 sccm to 300 sccm, and a $PH_3$ gas flow rate in the range from 100 sccm to 400 sccm may be used during the growth of capping layer 114. The HCl and Si precursor gas flow is adjusted during the epitaxial growth of capping layer 114 such that the process gas mixture has a ratio of Cl to Si atom concentration in a range from 3 to 10. Capping layer 114 may be in-situ doped with n-type dopant (e.g., phosphorus) to have a dopant concentration of about $1\times10^{20}$ atoms/$cm^3$.

Example Embodiments and Benefits

The present disclosure describes methods for reducing contact resistance between epitaxial source/drain (S/D) regions in finFETs and other structures (e.g., S/D contact structures) of the finFET and/or other structures (e.g., interconnects, vias) of an integrated circuit including the finFET. In an embodiment, the method includes epitaxially growing capping layers using an ELO process on merged epitaxial regions of the S/D regions. By controlling the process parameters (e.g., an etching gas element concentration to deposition gas element concentration ratio) during the ELO process, less conformal and more planar (e.g., substantially planar) top surfaces of the capping layers may be achieved compared to conformal and/or non-planar capping layer top surfaces of other finFETs. In some embodiments, a ratio of vertical dimensions between the lowest points on capping layer top surfaces and the merged region top surfaces and between the highest points on capping layer top surfaces and the merged region top surfaces may be greater than 1 (e.g., greater than about 1.1, 1.5, 2, or 5, in a range from about 1.1 to about 5). The variations in this ratio may be obtained as required per device design by adjusting the etching gas element concentration to deposition gas element concentration ratio in the ELO process. Such less conformal and more planar capping layers help to planarize the non-planar topography of the underlying top surfaces of the merged regions and act as contact areas for coupling structures (e.g., S/D contact structures, interconnects, or vias) of the finFETs and/or the integrated circuit to the merged regions. Planarized top surfaces of the merged regions help to reduce contact resistance between the S/D regions and the other structures coupled to it compared to other finFETs having S/D regions with less planar contact area topography. The capping layer grown using the ELO process achieves a substantially planar top surface having a vertical dimension less than or equal to 5 nm between the highest and lowest points on the surface. Whereas the vertical dimension between the highest and lowest points on other capping layers grown using non-ELO process is greater than 15 nm (e.g., greater than 20 nm). Furthermore, the addition of the ELO-process-grown capping layer on the merged regions of the S/D regions helps to increase the overall merged area of the S/D regions compared to finFETs having capping layers grown using non-ELO processes, where the increase is in a range from 60% to 80%.

In an embodiment, a method of forming a semiconductor device includes forming fin regions on a substrate, forming a patterned polysilicon structure over the fin regions, and etching back portions of the fin regions that are not covered by the patterned polysilicon structure to form recessed fin regions. The method further includes forming a merged epitaxial region on the recessed fin regions and forming a capping layer on the merged epitaxial region using an etching gas and a deposition gas. The merged epitaxial region includes a non-planar top surface topography and the capping layer includes a substantially planar top surface topography. Forming the capping layer includes epitaxially growing a material of the capping layer faster along a first crystal direction of the capping layer than a second crystal direction of the capping layer by adjusting a ratio of a concentration of a first element in the etching gas to a concentration of a second element in the deposition gas, the first and second elements being different from each other, the first and second crystal directions being different from each other.

In a further embodiment, a method of forming a finFET includes forming fin regions on a substrate and etching back portions of the fin regions to form recessed fin regions. The method further includes forming a merged epitaxial region on the recessed fin regions and forming a capping layer on the merged epitaxial region using an etching gas and a deposition gas. Forming the capping layer includes adjusting a ratio of a concentration of a first element in the etching gas to a concentration of a second element in the deposition gas to epitaxially grow a top surface of the capping layer having a vertical dimension between a highest point and a lowest point on the top surface less than or equal to 5 nm, the first and second elements being different from each other.

In a still further embodiment, a semiconductor device includes a fin structure on a substrate and a replacement gate structure disposed on the fin structure. The fin structure includes a source/drain region having a merged epitaxial region having a non-planar top surface topography and an epitaxial capping layer disposed on the merged epitaxial region. The capping layer includes a substantially planar top surface topography that has a vertical dimension between a highest point and a lowest point on the top surface less than or equal to 5 nm.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the subjoined claims.

What is claimed is:

1. A semiconductor device, comprising:
   fin regions on a substrate;
   shallow trench isolation (STI) regions between the fin regions;
   a replacement gate structure over the fin regions and the STI regions;
   a merged epitaxial region; and
   a capping layer, on the merged epitaxial region, with a top surface having a vertical dimension between a highest point and a lowest point less than about 5 nm.

2. The semiconductor device of claim 1, wherein the capping layer is thicker along a [110] crystal direction of the capping layer than along a [001] or [111] crystal direction of the capping layer.

3. The semiconductor device of claim 1, wherein a thickness of the capping layer ranges from about 2 nm to about 7 nm.

4. The semiconductor device of claim 1, wherein the capping layer comprises an n-type epitaxial material.

5. The semiconductor device of claim 1, wherein the capping layer comprises silicon doped phosphorous with a phosphorous dopant concentration between about $1 \times 10^{19}$ atoms/cm$^3$ and about $1 \times 10^{21}$ atoms/cm$^3$.

6. The semiconductor device of claim 1, wherein the merged epitaxial region comprises silicon doped phosphorous with a phosphorous dopant concentration between about $1 \times 10^{19}$ atoms/cm$^3$ and about $4 \times 10^{21}$ atoms/cm$^3$.

7. The semiconductor device of claim 1, wherein the capping layer comprises a silicon doped phosphorous epitaxial layer.

8. The semiconductor device of claim 1, further comprising
   an insulating void positioned under the merged epitaxial region.

9. A semiconductor structure, comprising:
   fin regions on a substrate;
   one or more replacement gate structures on the fin regions;
   a merged epitaxial region on the fin regions; and
   a capping layer, on the merged epitaxial region, with a top surface having a vertical dimension between a highest point and a lowest point less than about 5 nm and a dopant concentration between about $1 \times 10^{19}$ atoms/cm$^3$ and about $1 \times 10^{21}$ atoms/cm$^3$.

10. The semiconductor structure of claim 9, wherein the dopant concentration comprises n-type dopants.

11. The semiconductor structure of claim 9, wherein the dopant concentration comprises phosphorous.

12. The semiconductor structure of claim 9, wherein the capping layer comprises an epitaxially grown phosphorous doped silicon.

13. The semiconductor device of claim 9, wherein a thickness of the capping layer ranges from about 2 nm to about 7 nm.

14. The semiconductor device of claim 9, wherein a ratio of a first vertical dimension between lowest points on the capping layer and the merged epitaxial region to a second vertical dimension between highest points on the capping layer and the merged epitaxial region is between 1 and 5.

15. The semiconductor device of claim 9, wherein the capping layer is thicker on a first crystal direction of the capping layer than on a second crystal direction of the capping layer, the first crystal direction being different from the second crystal direction.

16. A semiconductor structure, comprising:
   recessed fin regions on a substrate;
   one or more replacement gate structures between the recessed fin regions;
   a merged epitaxial region, on the recessed fin regions, with a non-planar top surface; and a capping layer, on the merged epitaxial region, with a substantially planar top surface, wherein a ratio of a first vertical dimension between lowest points of the capping layer and the merged epitaxial region to a second vertical dimension between highest points of the capping layer and the merged epitaxial region is between 1 and 5.

17. The semiconductor structure of claim 16, wherein the capping layer comprises phosphorous doped silicon with a phosphorous dopant concentration between about $1 \times 10^{19}$ atoms/cm$^3$ and about $1 \times 10^{21}$ atoms/cm$^3$.

18. The semiconductor structure of claim 16, wherein the capping layer and the merged epitaxial region comprise silicon doped phosphorous.

19. The semiconductor structure of claim 16, wherein a thickness of the capping layer ranges from about 2 nm to about 7 nm.

20. The semiconductor structure of claim 16, wherein a vertical distance between a highest point and a lowest point of the capping layer on the substantially planar top surface is between about 3 nm and about 5 nm.

\* \* \* \* \*